United States Patent
Nakao et al.

(10) Patent No.: US 9,156,261 B2
(45) Date of Patent: Oct. 13, 2015

(54) PIEZOELECTRIC UNIT, LIQUID EJECTING HEAD, LIQUID EJECTING APPARATUS AND METHOD OF MANUFACTURING PIEZOELECTRIC UNIT

(71) Applicant: Seiko Epson Corporation, Tokyo (JP)

(72) Inventors: Hajime Nakao, Azumino (JP); Eiji Natori, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/295,706

(22) Filed: Jun. 4, 2014

(65) Prior Publication Data

US 2014/0368582 A1    Dec. 18, 2014

(30) Foreign Application Priority Data

Jun. 12, 2013   (JP) ................. 2013-123323

(51) Int. Cl.
| | |
|---|---|
| *B41J 2/045* | (2006.01) |
| *B41J 2/14* | (2006.01) |
| *B41J 2/16* | (2006.01) |
| *H01L 41/08* | (2006.01) |
| *H01L 41/09* | (2006.01) |

(52) U.S. Cl.
CPC .......... *B41J 2/14233* (2013.01); *B41J 2/14201* (2013.01); *B41J 2/161* (2013.01); *B41J 2/1623* (2013.01); *B41J 2/1628* (2013.01); *B41J 2/1631* (2013.01); *B41J 2/1632* (2013.01); *B41J 2/1645* (2013.01); *B41J 2/1646* (2013.01); *H01L 41/081* (2013.01); *H01L 41/0973* (2013.01); *Y10T 29/42* (2015.01)

(58) Field of Classification Search
CPC ..................................................... B41J 2/14201
See application file for complete search history.

(56) References Cited

U.S. PATENT DOCUMENTS

| | | | |
|---|---|---|---|
| 6,086,187 A | 7/2000 | Hattori et al. | |
| 2004/0256953 A1* | 12/2004 | Kitagawa et al. | ............. 310/324 |

FOREIGN PATENT DOCUMENTS

| | | |
|---|---|---|
| EP | 2255965 A1 | 12/2010 |
| JP | 03-205155 A | 9/1991 |
| JP | 2012-201025 A | 10/2012 |
| JP | 5084942 B2 | 11/2012 |

\* cited by examiner

*Primary Examiner* — Geoffrey Mruk
(74) *Attorney, Agent, or Firm* — Harness, Dickey & Pierce, P.L.C.

(57) ABSTRACT

A piezoelectric unit includes a diaphragm made of ceramics, a base portion having a pressure chamber in which the diaphragm is set to a wall and a piezoelectric element having a dielectric layer provided at the opposite side of the base portion with respect to the diaphragm. In the piezoelectric unit, the roughness of a crystal of the outermost interface at the side of the piezoelectric element of the diaphragm is further smoothened than that of a ceramics material which is included in the diaphragm more inside than the interface.

8 Claims, 7 Drawing Sheets

PIEZOELECTRIC UNIT, LIQUID EJECTING HEAD, LIQUID EJECTING APPARATUS AND METHOD OF MANUFACTURING PIEZOELECTRIC UNIT

BACKGROUND

1. Technical Field

The present invention relates to a piezoelectric unit, a liquid ejecting head, a liquid ejecting apparatus and a method of manufacturing a piezoelectric unit.

2. Related Art

In the related art, a piezoelectric unit that realizes a predetermined function using a piezoelectric phenomenon has been known. For example, the piezoelectric unit changes a mechanical change such as the deflection to electric energy and converts a change in electric energy into a mechanical change.

As an example of a product using the piezoelectric unit, one including a piezoelectric element and a channel in which a change in pressure occurs by the piezoelectric element, in which the channel is modified by deflecting the piezoelectric element by a signal which is externally added and a liquid of the inside of the channel is discharged, is disclosed (refer to Japanese Patent No. 5084942 and JP-A-2012-201025).

In a case where the part in which the piezoelectric element is fixed is configured by ceramics, a decrease in a piezoelectric constant, a decrease in the stability of an operation, and furthermore, a decrease in the durability of the piezoelectric element sometimes became a problem, compared to one in which such a part is not configured by ceramics.

SUMMARY

An advantage of some aspects of the invention is to attain high performance and high reliability in a piezoelectric unit partially including ceramics.

According to an aspect of the invention, there is provided a piezoelectric unit including a diaphragm made of ceramics, a base portion having a pressure chamber in which the diaphragm is set to a wall and a piezoelectric element having a dielectric layer provided at the opposite side of the base portion with respect to the diaphragm, in which the roughness of the outermost interface at the side of the piezoelectric element of the diaphragm is further smoothened than that of a crystal of a ceramics material which is included in the diaphragm more inside than the interface.

In the invention configured as described above, a planarizing layer is formed between the diaphragm configured by the ceramics and the piezoelectric element. Therefore, since the orientation of the crystal of the dielectric layer is aligned by the planarizing layer, a piezoelectric constant, the stability of an operation, and furthermore, the durability of; the piezoelectric element may be improved.

Here, the dielectric layer is a layer converting an electric change into a mechanical change (distortion) or a layer performing the inverse conversion thereof by a piezoelectric effect and an electrostrictive effect. For example, the dielectric layer is a piezoelectric layer configured by a piezoelectric material, an electrostrictive layer configured by an electrostrictive material, a pyroelectric layer configured by a pyroelectric material, a ferroelectric layer configured by a ferroelectric material or a layer configured by a combination thereof.

In addition, even if the layer is a layer using the piezoelectric material, a component having the electrostrictive effect is included in a component generating a distortion. Therefore, the term "piezoelectric" is also used as a simplified expression including piezoelectric and electrostrictive.

In addition, the diaphragm includes a first layer configuring the interface and a second layer located at the side of the base portion closer than the first layer, in which the first layer has a smaller crystal size compared to the second layer and may be configured with the planarizing layer.

In the invention configured as described above, the diaphragm is flattened by reducing the crystal size at the side of the piezoelectric element of the diaphragm and thus the planarizing layer in a member using the ceramics may be easily formed.

Then, the piezoelectric element may be configured by including a first electrode provided between the interface and the dielectric layer and a second electrode provided at the opposite side of the first electrode with respect to the dielectric layer.

In the invention configured as described above, the crystal orientation of the dielectric layer may be aligned owing to including a lower electrode configured by a metal on the planarizing layer.

Furthermore, the end portion of the first electrode may be set to a configuration formed by extending over from an active portion to an inactive portion of the piezoelectric element.

At a joining portion between the diaphragm and a spacer, a stress concentration easily occurs by driving the piezoelectric element, and in particular, the end portion (short side) in a longitudinal direction of the pressure chamber is noticeable. The stress concentration also becomes a factor of an occurrence of a crack. Therefore, in the invention configured as described above, the part in which the stress concentration of the diaphragm easily occurs may be reinforced by the lower electrode, and thus the durability of the piezoelectric unit may be enhanced.

In addition, the end portion of the first electrode is formed longer than the end portion of the second electrode by a length d in the predetermined direction, and the length d may be set to be thicker than the thickness of the dielectric layer configuring the piezoelectric element.

Then, the crystal orientation of the dielectric layer may be preferentially oriented to (100).

Since the orientation of the crystal of the dielectric layer is preferentially oriented to (100), an occurrence of 90° domain may be suppressed and the piezoelectric constant may be increased. In addition, a polarization axis may be stabilized and the fluctuation of the displacement amount of the piezoelectric layer 82 may be reduced, by being preferentially oriented to (100). As a result, the function of the piezoelectric element may be enhanced.

Here, as a technique of observing the crystal orientation of the dielectric layer, for example, the crystal orientation of the dielectric layer may be observed by an analysis using well-known transmission electron microscope; TEM or X-ray analysis.

Furthermore, the invention may also be applied with respect to a liquid ejecting head provided with such a piezoelectric unit.

In addition, the invention may also be applied with respect to a liquid ejecting apparatus having such a liquid ejecting head.

Also, the invention may also be applied as an invention of a manufacturing method of manufacturing the piezoelectric unit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, description will be given of an embodiment of the invention. Obviously, the embodiment described below only exemplifies the invention and all characteristics shown in the embodiment does not necessarily become essential to the solution of the invention.

1. First Embodiment

Figure 1A:
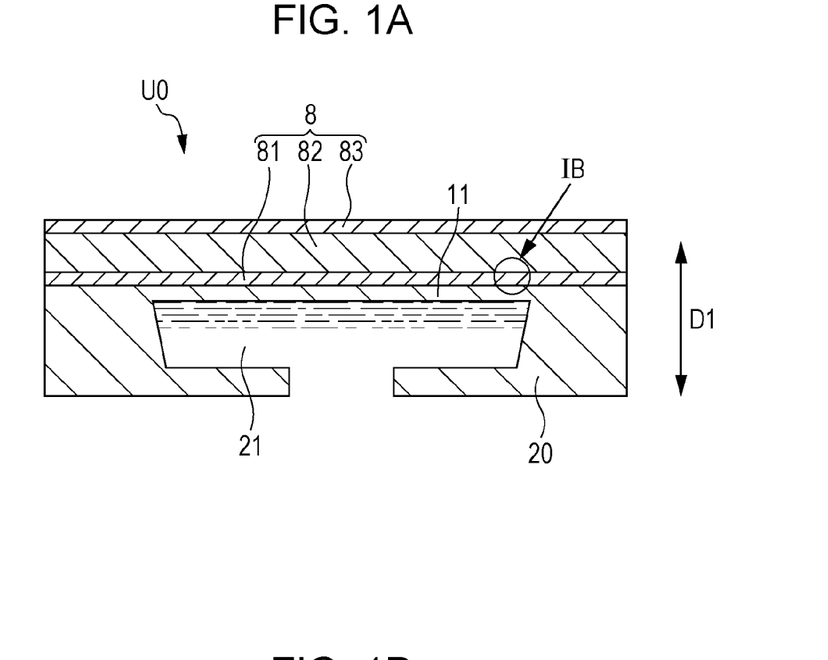
FIGS. 1A and 1B are cross section views schematically exemplifying a piezoelectric unit which is provided with a piezoelectric element, before and after use.
Figure 1B:
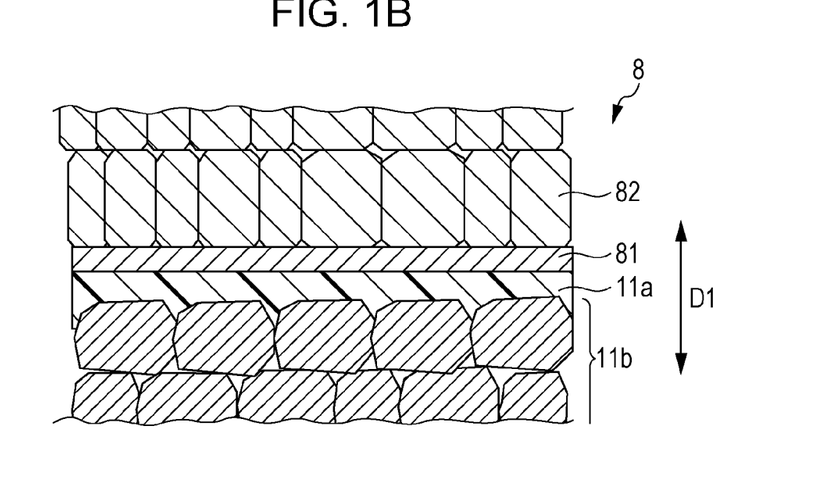
Figure 2:
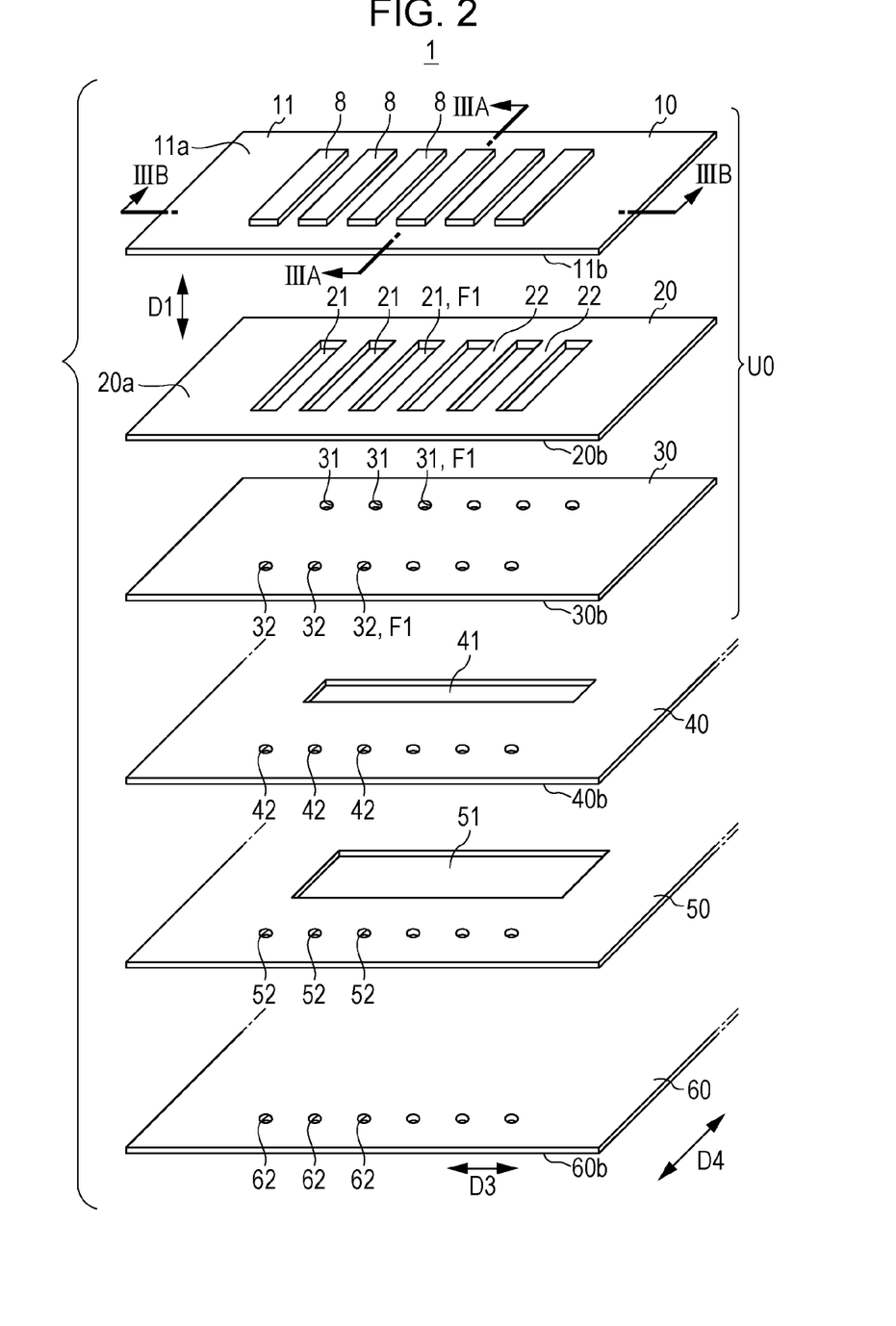
FIG. 2 is an exploded perspective view schematically exemplifying a configuration of a liquid ejecting head.
Figure 3A:
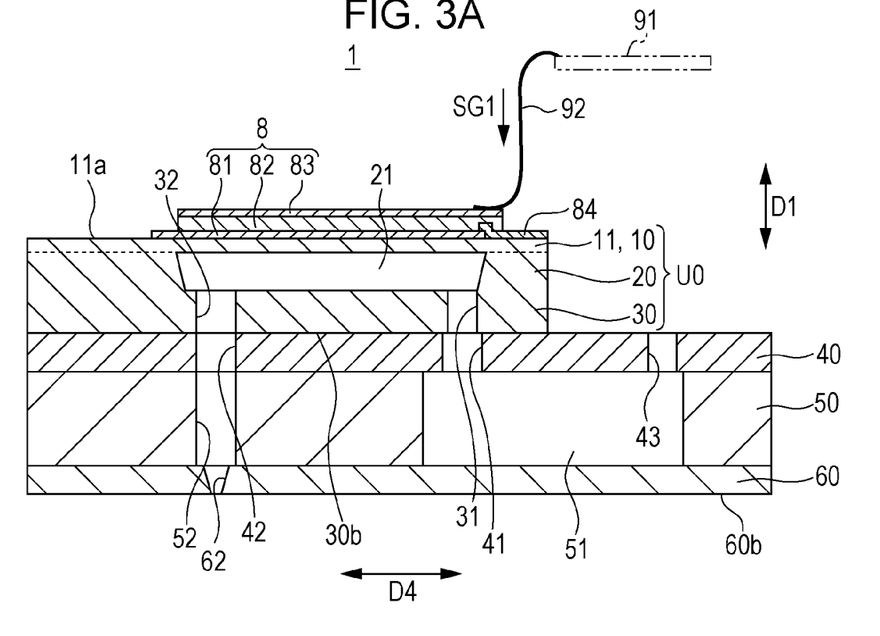
FIGS. 3A and 3B are cross section views of a liquid ejecting head at the position of IIIA-IIIA and IIIB-IIIB in FIG. 2, respectively.
Figure 3B:
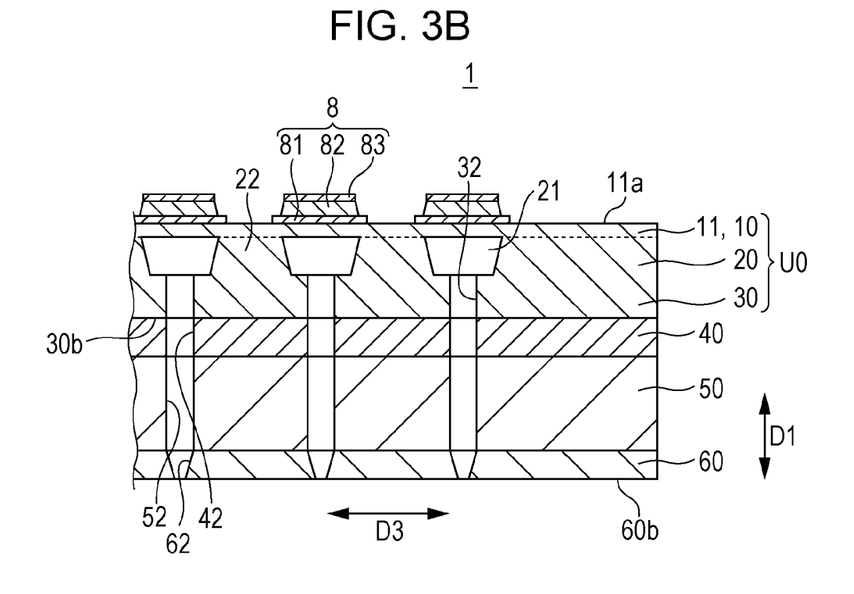

Firstly, description will be given of examples of a piezoelectric unit and a liquid ejecting head. FIGS. 1A and 1B are views schematically showing a piezoelectric unit U0 which is provided with a piezoelectric element 8, before and after use. FIG. 1B is a view showing by enlarging the part of IB in a cross section view shown in FIG. 1A. In order to understandably show, crystal particles are shown in a size larger than the actual size. Obviously, the size of the crystal particles to a thickness of the diaphragm is not particularly limited, the size of a gap to the particles is also not particularly limited, and the shape of the particles is also not particularly limited. FIG. 2 exemplifies an outline of a configuration of a liquid ejecting head 1 including a piezoelectric unit U0. FIG. 3A shows a cross section view of a liquid ejecting head 1 at the position of IIIA-IIIA in FIG. 2. FIG. 3B shows a cross section view of a liquid ejecting head 1 at the position of IIIB-IIIB in FIG. 2.

In the drawings described above, a reference D1 indicates a thickness direction of the piezoelectric unit U0. A reference D3 indicates a longitudinal direction of the piezoelectric unit U0, and for example, is a direction in which a pressure chamber 21 in a long shape is installed side by side and is a width direction of the pressure chamber 21. A reference D4 indicates a short length direction of the piezoelectric unit U0, and for example, is a longitudinal direction of the pressure chamber 21. Each direction D1, D3 and D4 is set to be orthogonal to each other; however, as long as they are intersected with each other, they may not be orthogonal. In order to understandably show, the magnification ratios of each direction D1, D3 and D4 are sometimes different, the area ratio of the piezoelectric element 8 is sometimes also different and each view is sometimes inconsistent.

Here, the positional relation described in the present specification is only an example for explaining the invention, and does not restrict the invention. Therefore, the invention also includes that the diaphragm is arranged at the positions, for example, at the lower part, the left part, the right part or the like, except the upper part of the pressure chamber. In addition, the terms "the same", "orthogonal or the like" for a direction, a position, or the like do not mean only strictly the same, orthogonal or the like, but have a meaning in which an error that occurs during manufacture or the like is also included. Furthermore, "contacting" and "joining" include both where there is an interposed one such as an adhesive agent in between and where there is not an interposed one in between.

The piezoelectric unit U0 shown in FIGS. 1A and 1B, or the like is provided with a diaphragm 11, a spacer portion (a base portion) 20 in which the diaphragm 11 is set to a part of a wall and the piezoelectric element 8 formed at the upper part of the diaphragm 11. The wall of the diaphragm 11 and the pressure chamber 21 except that is configured by the ceramics such as zirconium oxide (ZrO) or aluminum oxide.

In addition, the diaphragm 11 is configured by plural layers in which the crystal structures are different. The diaphragm 11 shown in FIG. 1B is configured by a first layer 11a located at the side of the piezoelectric element 8 and a second layer 11b located at the side of the pressure chamber 21. The crystal particles of the interface at the side of the piezoelectric element 8 of the first layer 11a are flattened compared to those of the interface at the side of the first layer 11a of the second layer 11b. Specifically, as to the first layer 11a, the crystal size is smaller or the arrangement is also more uniform, compared to the second layer 11b, and the first layer 11a is densely filled into the roughness of the crystal of the second layer 11b, and thus the smooth interface is obtained. Moreover, in the first embodiment, since the first layer 11a and the second layer 11b are integrated after calcining, the border in which the crystal size is clearly changed does not exist.

In addition, configuring the diaphragm 11 with two layers is only one example and the diaphragm 11 may be one in which a different layer between the first layer 11a and the second layer 11b is included.

The piezoelectric element 8 is configured by a lower electrode 81 (a first electrode), a piezoelectric layer 82 (a dielectric layer) and an upper electrode 83 (a second electrode). The lower electrode 81 is formed right above the first layer 11a and the crystal orientation is orientated in the predetermined direction. As the quality of material of the lower electrode 81, a metal such as platinum (Pt), iridium (Ir) or ruthenium (Ru) or an oxide thereof, an oxide such as strontium ruthenate (SrRU0) or lanthanum nickelate (LaNiO) or a composite thereof (lamination, mixed phase) can be used.

In addition, the piezoelectric layer 82 is formed right above the lower electrode 81 in accordance with the position of the pressure chamber 21 formed at the spacer portion 20. For the piezoelectric layer 82, a dielectric material such as a non-lead-based material containing lead zirconate titanate (PZT), barium titanate ($BTio_3$) or bismuth ferrite ($BiFeO_3$) can be used.

Moreover, in the first embodiment, as a dielectric layer, description will be given of the piezoelectric layer 82 configured by containing a piezoelectric material as an example, however, the dielectric layer may be one used a layer configured by containing a dielectric material except that. For example, the dielectric layer may be the electrostrictive layer in which a relaxer ferroelectrics in which a metal such as niobium, nickel, magnesium, bismuth or yttrium is added to lead zirconate titanate (PZT), barium titanate ($BTio_3$) or bismuth ferrite ($BiFeO_3$) described above is used as a material. Besides the above, the dielectric layer may also be a ferroelectric layer configured by a ferroelectric material, a pyroelectric layer configured by a pyroelectric material, and furthermore, a layer in which the piezoelectric layer, the electrostrictive layer, the pyroelectric layer and the ferroelectric layer are combined.

Moreover, since the distortion (modification) of the piezoelectric layer 82 contains an electrostrictive component, in a case of mentioning the term "piezoelectric", it is used as a simplified expression containing an electrostrictive component.

Also, the crystal orientation of the piezoelectric layer 82 is preferentially oriented in the predetermined orientation. For example, in a case where the piezoelectric layer 82 is configured by PZT or BFO-BTO, the crystal orientation is preferentially oriented to (100). Furthermore, the crystal of the piezoelectric layer 82 grows in the columnar shape due to the orientation degree becoming higher.

It is possible to suppress an occurrence of 90° domain and increase the piezoelectric constant due to the piezoelectric layer formed by PZT or BFO-BTO being preferentially oriented to (100). Here, a case of being orthogonal with respect to a polarization direction of the piezoelectric layer 82 is referred to as 90° domain and a case of being parallel is referred to as 180° domain. It is considered that significant degradation in the piezoelectric characteristics is caused when the number of 90° domain in the piezoelectric layer 82 becomes larger. In addition, it is possible to stabilize the polarization axis and reduce the fluctuation of the displacement amount of the piezoelectric layer 82 by being preferentially oriented to (100).

The orientation degree of (100) of the crystal orientation configuring the piezoelectric layer 82 is 75% or more and preferably 95% or more. In addition, as a method of judging the orientation degree of the piezoelectric layer 82, a well-known Lotgering method can be used. Here, the orientation degree using the Lotgering method expresses each orientation ratio when the total sum of peaks of each orientation obtained by X-ray diffraction is set to 1, and is an average orientation degree determined by a computation method in which the denominator is set to the total sum of each peak strength and the numerator is set to a peak strength of an arbitrary orientation.

Furthermore, the upper electrode 83 is formed right above the piezoelectric layer 82. As the quality of material of the upper electrode 83, a metal such as platinum (Pt), iridium (Ir) or ruthenium (Ru) can be used.

In a case where the spacer portion 20 or the like is configured by the ceramics, it is known that the surface thereof becomes rougher, compared to a case of not configuring by the ceramics. That is, since the ceramics are a sinter of a powder and are sintered at high temperature, it is difficult to grow the crystal and the surface of the diaphragm 11 becomes rough. In addition, if the surface of the diaphragm 11 is rough, in a forming process of the piezoelectric element 8, the crystal growth configuring the piezoelectric layer 82 is affected by the surface roughness of the interface, and thus it is known that the crystal orientation is not aligned. That is, as to the piezoelectric element 8, the lower electrode 81, the piezoelectric layer 82, and the upper electrode 83 are formed in this order on the diaphragm 11, however, when the surface of the diaphragm 11 is rough, the surface of the lower electrode 81 also becomes rough in forming the lower electrode 81 on the diaphragm 11. Then, when the piezoelectric layer 82 is formed with respect to such a lower electrode 81, in a process of the crystal growth of the piezoelectric layer 82, the crystal orientation is not aligned, and thus the orientation degree becomes low. Also, the orientation degree of the piezoelectric layer 82 is low, there are some cases where the performance (piezoelectric constant, or the like) of the piezoelectric element 8 is reduced.

Furthermore, when the surface of the diaphragm 11 is rough, in the process of the crystal growth of the piezoelectric layer 82, the stress concentration occurs on the interface between the lower electrode 81 and the diaphragm 11, and thus this becomes a factor that makes the crack generate on the piezoelectric layer 82. When the crack occurs on the piezoelectric layer 82, since the pressure resistance (V/m) of the piezoelectric element 8 is also reduced, the margin of the voltage and the displacement amount in which the piezoelectric element 8 can allow becomes low and thus the operation is unstable.

Then, in the present embodiment, in order to alleviate a problem generated by configuring the piezoelectric unit U0 by the ceramics, the planarizing layer (the first layer 11a) is formed on the interface between the diaphragm 11 and the piezoelectric element 8. That is, it is possible to align the crystal orientation of the piezoelectric layer 82 and enhance the piezoelectric constant and the stability of the operation of the piezoelectric element 8 by providing with the planarizing layer.

Moreover, forming the planarizing layer with the layer of a part of the diaphragm 11 is only one example. For example, the piezoelectric unit U0 may be one in which a layer which functions as a planarizing layer between the diaphragm 11 and the lower electrode 81 is provided.

Figure 7:
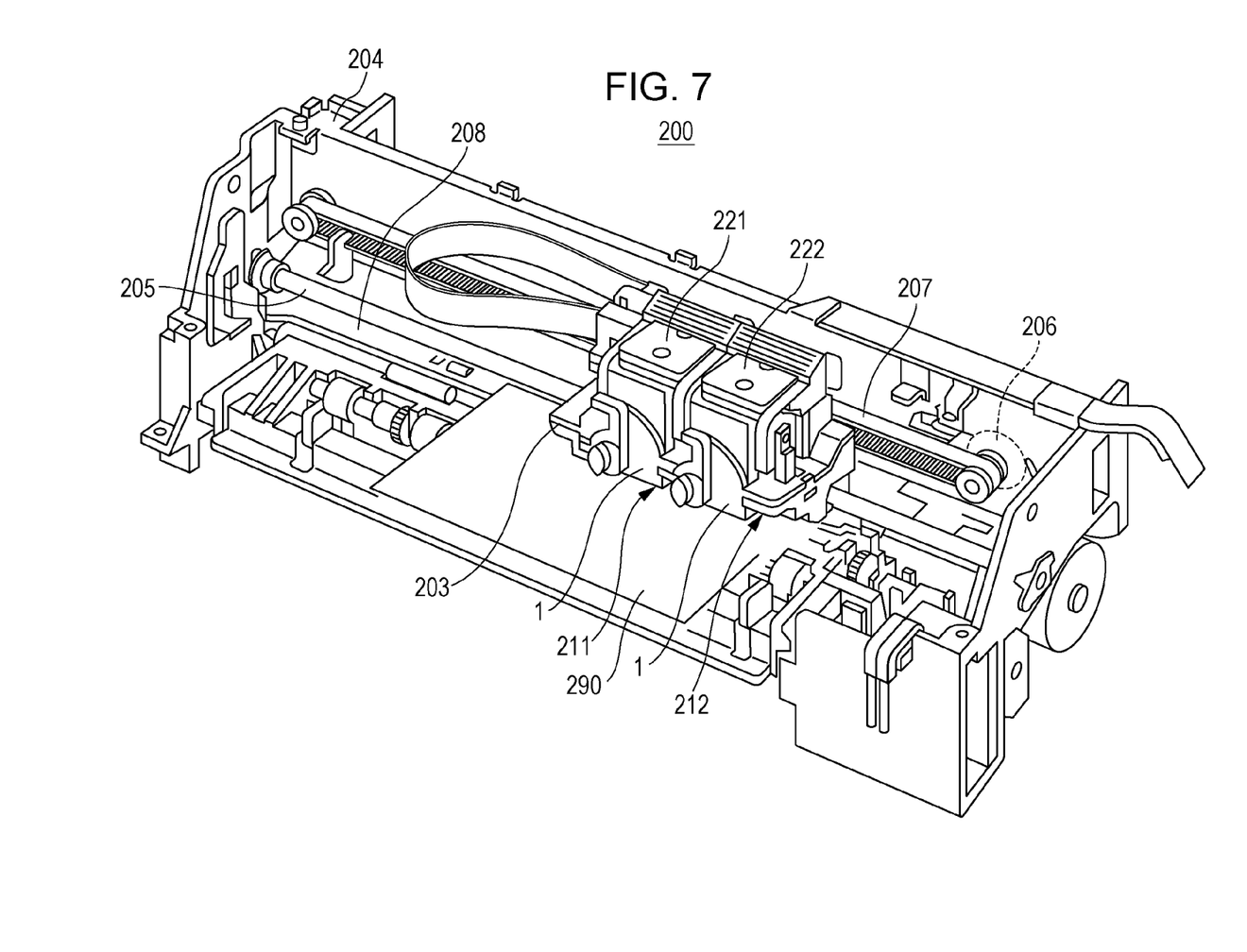
FIG. 7 is a view exemplifying an outline of a configuration of a liquid ejecting apparatus.

Next, description will be given of a liquid ejecting head 1 provided with such a piezoelectric unit U0. The liquid ejecting head 1 shown in FIG. 2 includes the piezoelectric unit U0, a sealing plate 40, a reservoir plate 50, furthermore, a nozzle plate 60, and is a ink jet type recording head which ejects (discharges) an ink (a liquid). A liquid ejecting apparatus 200 exemplified in FIG. 7 is an ink jet printer (a recording apparatus) mounting the liquid ejecting head as described above.

Moreover, the liquid ejecting head 1 does not necessarily require being provided with the sealing plate 40 or the reservoir plate 50. For example, in a case where there is not the sealing plate, the reservoir plate can be set to a joined substrate and in a case where there is not the reservoir plate, the nozzle plate can be set to a joined substrate. In addition, the liquid ejecting head may be provided with another plate such as a so-called compliance plate, for example, the compliance plate may also be arranged between the reservoir plate and the nozzle plate. Furthermore, these plates may be configured by plural plates and one plate may be provided with functions of plural plates.

A diaphragm portion 10 is a piezoelectric actuator including the diaphragm 11, the piezoelectric element 8, a lead electrode 84 or the like. The pressure is added to a liquid in the pressure chamber 21 by the diaphragm portion 10 being modified in accordance with a driving signal SG1.

The diaphragm 11 seals one surface (surface 20a) of the spacer portion 20 and the piezoelectric element 8 (configured by at least a pair of electrodes and the piezoelectric layer sandwiched between a pair of electrodes), the lead electrode 84, or the like is provided on the surface of the opposite side to the back surface which contacts with the spacer portion 20. The back surface of the diaphragm configures a part of the wall surface of the pressure chamber 21. That is, the diaphragm 11 which is a part of the wall of the pressure chamber 21 is modified in accordance with the driving signal SG1 by the piezoelectric element 8. The diaphragm 11 may have a rectangular plate shape or may not have a rectangular plate shape.

As describe above, the diaphragm 11 includes the first layer 11a and the second layer 11b in which the crystal structures or the like is different. The crystal size of the first layer 11a is smaller, compared to that of the second layer 11b. Therefore, the interface between the first layer 11a and the lower electrode 81 is further flattened, compared to the interface between the second layer 11b and the spacer portion 20. In the embodiment, the planarizing layer is formed by the first layer 11a.

The thickness of the diaphragm 11 can be set to, for example, from 1.0 μm to 4.5 μm. When the diaphragm 11 is thin, a phenomenon in which a liquid in the pressure chamber 21 permeates the diaphragm 11 (also described as an ink pass) becomes a problem. However, continU0us gaps between the crystals is suppressed by configuring the diaphragm 11 by plural layers in which the crystal structures are different (the first layer 11a and the second layer 11b), and thus it is possible to suppress the permeation of the liquid.

Moreover, as a technique of observing the crystal structure of the diaphragm 11, the crystal structure can be observed using a well-known transmission electron microscope; TEM or X-ray diffraction.

The pressure chamber 21 which penetrates in a thickness direction D1 is formed on the spacer portion 20. The pressure chamber 21 is provided inside the piezoelectric unit U0 by the spacer portion 20 being sandwiched between the diaphragm 11 and a connection portion 30. The spacer portion 20 may have a rectangular plate shape or may not have a rectangular plate shape.

Each pressure chamber 21 provided on the spacer portion 20 is formed in a long shape in which the longitudinal direction is set toward the short length direction D4 of a channel substrate, and plural pressure chambers 21 are apposed in the longitudinal direction D3 of the channel substrate. A partition wall 22 is set between the pressure chambers 21. The pressure is added to the liquid in the pressure chambers 21 by the modification of the diaphragm 11 which is a part of the wall. The shape of the pressure chamber 21 is not limited to this shape, and can be set to an arbitrary shape. For example, as to a width or a length of the pressure chamber 21, the length of the side of the back surface 20b may be set to the length shorter than the length of the side of the surface 20a. The plural rows of the pressure chamber 21 apposed in the longitudinal direction D3 of the channel substrate may be apposed in the short length direction D4 of the channel substrate.

The piezoelectric element 8 includes the lower electrode 81, the piezoelectric layer 82 and the upper electrode 83 described above. Each piezoelectric element 8 shown in FIG. 2, and FIGS. 3A and 3B is located at the positions compatible with each pressure chamber 21. A control circuit substrate 91 for controlling driving of the piezoelectric element 8, for example, is connected with respect to the upper electrode 83 through the cables 92 such as a flexible substrate. One of the electrodes 81 and 83 may be a common electrode. As to the constituent metal of the upper and lower electrodes, for example, one kind or more of Pt (platinum), Au (gold), Ir (iridium), Ti (titanium), or the like can be used.

The lead electrode 84 may be connected to the lower electrode 81 or may be connected to the upper electrode 83. One kind or more of Au, Pt, Al (aluminum), Cu (copper), Ni (nickel), Cr (chromium), Ti, or the like can be used for the constituent metal of the lead electrode.

Figure 4:
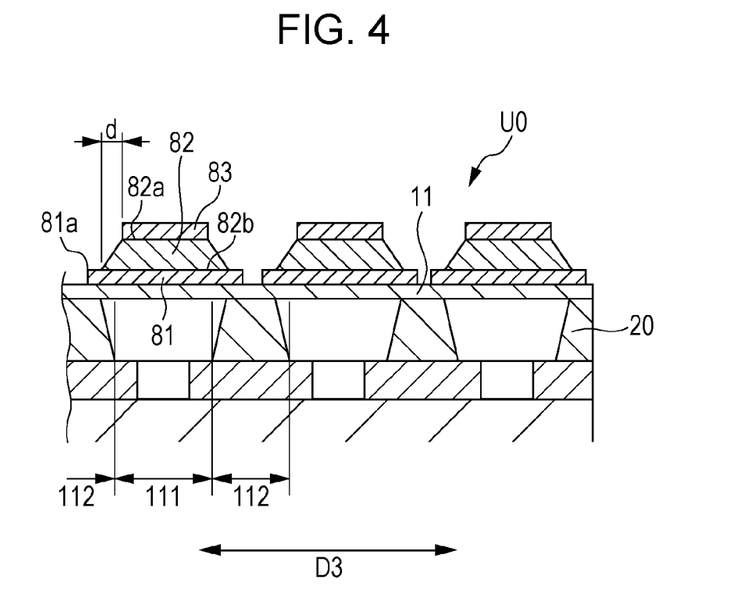
FIG. 4 is a cross section view showing a piezoelectric unit.

FIG. 4 is a cross section view showing a part of the piezoelectric unit U0. As shown in FIG. 4, the piezoelectric layer 82 is tilted from the upper end 82a (the end portion of the side of the upper electrode 83) to the lower end 82b (the end portion of the side of the lower electrode 81) in a third direction D3. That is, in the third direction D3, the lower end 82b becomes longer than the upper end 82a by only the length d. As to the piezoelectric layer 82, an electric field concentration becomes noticeable at the end portion when an electric field is generated. When the electric field is concentrated, the insulation breakdown, or the stress difference between the part on which the electric field is concentrated and the part on which the electric field is not concentrated when the piezoelectric layer 82 is modified occurs, thus this becomes a factor of an occurrence of a crack. Therefore, the electric field concentration is relaxed by being provided with the tilt at the end portion of the piezoelectric layer 82, and thus the crack generated on the piezoelectric layer 82 is suppressed. Moreover, the length d is preferably the thickness of the piezoelectric layer 82 or more, however, the length d is not limited thereto.

In addition, as shown in FIG. 4, the part in which a force generated by the modification of the piezoelectric element 8 in the diaphragm 11 is directly added is described as an active portion 111 of the piezoelectric element 8 (in FIG. 4, an area shown by an arrow). In addition, in the vicinity part facing the pressure chamber 21 of the diaphragm 11, the part in which a force is not directly added by the modification of the piezoelectric element 8 is described as an inactive portion 112. In contrast to this, the part which is modified in accordance with the modification of the piezoelectric element 8 in the diaphragm 11 is also described as an active portion in the diaphragm 11. Hereinafter, when the active portion 111 and the inactive portion 112 are described, the active portion 111 and the inactive portion 112 mean the active portion and the inactive portion of the piezoelectric element 8. In FIG. 4, the active portion 111 is an area in which the lower electrode 81, the piezoelectric layer 82 and the upper electrode 83 in the diaphragm 11 which becomes the wall of the pressure chamber 21 are overlapped. In addition, the inactive portion 112 is an area except the active portion 111. Moreover, the positions of the active portion 111 and the inactive portion 112 are not limited thereto.

Here, the end portion 81a of the lower electrode 81 extends to the active portion and the inactive portion on the diaphragm 11 in the third direction D3. That is, the end portion 81a of the lower electrode 81 reaches the border between the active portion 111 and the inactive portion 112. At the border between the active portion 111 and the inactive portion 112, the stress concentration is easily occurs by the modification of the piezoelectric element 8 and thus the crack easily occurs on the diaphragm 11. Therefore, in the embodiment, the diaphragm 11 is protected by being covered from a part to the whole area of the border between the active portion 111 and the inactive portion 112 with the lower electrode 81. The complaisance function of the deflection part of the diaphragm 11 deteriorates by covering with the lower electrode 81, furthermore, the modification volume of the diaphragm 11 decreases. Therefore, the part covered by the lower electrode 81 is preferably set to a place which needs to be reinforced, for example, the end portion of the longitudinal direction described above.

At the connection portion 30, a supply hole 31 and a nozzle communication hole 32 for a liquid, which penetrate in the thickness direction D1 are formed at the position communicating to each pressure chamber 21. That is, the connection portion 30 seals the other surface (the back surface 20b) of the opposite side to the surface 20a at the spacer portion 20 except the holes 31 and 32. The connection portion 30 may have a rectangular plate shape or may not have a rectangular plate shape. Each supply hole 31 is provided at the position corresponding to one end of the longitudinal direction (D4) of each pressure chamber 21, and each nozzle communication hole 32 is provided at the position corresponding to the other end of the longitudinal direction (D4) of each pressure chamber 21. The holes 31 and 32, and the pressure chamber 21 become a liquid channel F1 of the piezoelectric unit U0.

Moreover, the diaphragm 11, the spacer portion 20 and the connection portion 30 become an integrated piezoelectric unit U0 by integrally calcining. Moreover, in a case of mentioning the piezoelectric unit, the piezoelectric unit may not have the connection portion 30.

A common supply hole 41, a nozzle communication hole 42 and a liquid introduction hole 43 (refer to FIG. 3A) to a reservoir 51 for a liquid, which penetrate in the thickness direction D1 are formed on the sealing plate 40 which is joined to the back surface 30b of the connection portion 30. The common supply hole 41 is formed in a long shape in which the longitudinal direction is directed at the longitudinal direction D3 of the sealing plate 40, and is provided at the position communicating to plural supply holes 31 of the connection portion. Each nozzle communication hole 42 is provided at the position communicating to each nozzle communication hole 32 at the connection portion. The liquid introduction hole 43 is provided at the position not contacting with the piezoelectric unit U0. The back surface 40b of the sealing plate configures a part of the wall surface of the reservoir 51.

On the reservoir plate 50, the reservoir 51 and a nozzle communication hole 52 which penetrate in the thickness direction D1 are formed. The reservoir 51 is a common ink chamber which is communicated to the common supply hole 41 and the liquid introduction hole 43. Each nozzle communication hole 52 is provided at the position communicating to each nozzle communication hole 42 of the sealing plate.

On the nozzle plate 60, a nozzle 62 which penetrates in the thickness direction D1 is formed at the position communicating to each nozzle communication hole 52. The back surface of the nozzle plate 60 is set to a nozzle surface 60b ejecting droplets from the nozzle 62. The nozzle plate 60 shown in FIG. 2, and FIGS. 3A and 3B includes a nozzle row in which the nozzle 62 communicating to each pressure chamber 21 is apposed in the predetermined direction (D3) at the predetermined interval. Plural nozzles may be arranged in a zigzag shape.

Moreover, as a material for various types of plates including the plates 40, 50 and 60 described above, for example, one kind or more of a metal such as stainless steel or nickel, a synthetic resin, ceramics or the like can be used.

In the liquid ejecting head 1 described above, a liquid such as an ink is introduced from the liquid introduction hole 43 to fill up the inside of the reservoir and passes through the common supply hole 41 and the individual supply holes 31 to fill up the inside of the pressure chamber 21. When the piezoelectric element 8 is modified as if the diaphragm 11 is inflated toward the side of the pressure chamber 21 corresponding to a driving voltage (driving signal SG1) from the control circuit substrate 91, accordingly, the diaphragm 11 is also modified and the pressure of the liquid inside the pressure chamber 21 due to the modification of the diaphragm 11 is increased, and thus droplets are ejected from the nozzle 62 through the nozzle communication holes 32, 42 and 52.

Next, a method of manufacturing the liquid ejecting head will be exemplified by referring to FIGS. 5A, 5B and 5C, and FIGS. 6A, 6B and 6C together with FIGS. 1A to 3B. FIGS. 5A, 5B and 5C and FIGS. 6A, 6B and 6C are process views showing a method of manufacturing the liquid ejecting head.

Figure 5A:
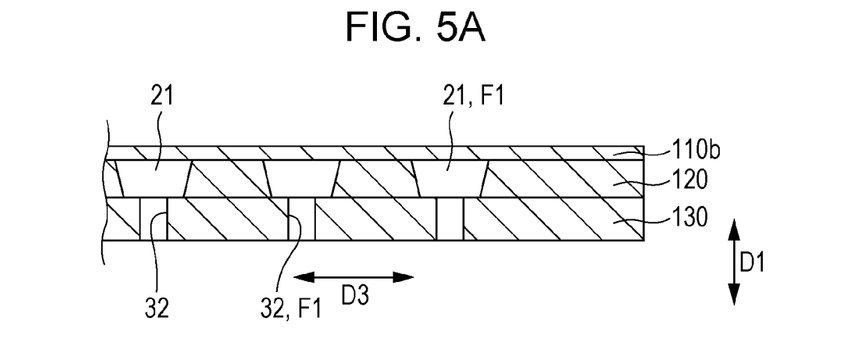
FIGS. 5A to 5C are process views showing a method of manufacturing a liquid ejecting head.

Firstly, as shown in FIG. 5A, precursors 110b, 120 and 130, including at least a base material which is made of ceramics, of the second layer 11b and the spacer portion 20 are formed. Here, as precursors 110b, 120 and 130, a rare earth oxide or a group 2 element is added to zirconia (ZrOx) with a predetermined molar ratio then this powder is dispersed in a binder or the like and a green sheet is used in which this paste is molded into a sheet-like shape.

For molding of the green sheet, a general apparatus such as a doctor blade apparatus or a reverse roll coater apparatus can be used. The green sheet 120 for the spacer portion 20 and the green sheet 130 for the connection portion 30 are subjected to a mechanical processing such as cleaving, cutting or punching, or a laser processing. In doing so, a spacer portion precursor 120 in a sheet-like shape, having the pressure chamber 21 is obtained and a connection portion precursor 130 in a sheet-like shape, having the holes 31 and 32 is obtained. As to the green sheet 110b for the diaphragm 11, a processing is not required if not necessary. Then, the diaphragm precursor 110b, the spacer portion precursor 120 and the connection portion precursor 130 are laminated.

The precursor may be formed by transferring using a mold except forming into a sheet-like shape.

In addition, silicon dioxide ($SiO_2$) is added for the purpose of removing carbon included in the binder or the like and silicon dioxide ($SiO_2$) may not be added.

Figure 5B:
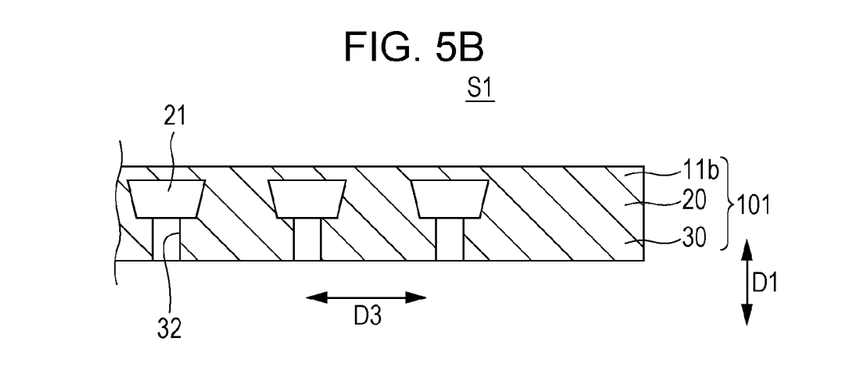

Next, the precursor described above is integrally calcined and the piezoelectric unit main body 101 is formed as shown in FIG. 5B (a first process S1). The calcination temperature is not particularly limited as long as the calcination temperature is a temperature at which the integrated piezoelectric unit main body made of ceramics is formed, and for example, the temperature can be set to from approximately 1,300° C. to 1,500° C. Before calcinating, the precursor may be degreased by heating at a degreasing temperature which is lower than a calcination temperature. Furthermore, before degreasing, the precursor may be dried by heating at a drying temperature which is lower than a degreasing temperature. A special adhesive treatment or the like is not required to be added for the obtained piezoelectric unit main body 101 and a sealing property on superposed surfaces of each portion 11b, 20 and 30 is obtained.

The piezoelectric unit main body may be formed by a gel-cast method using a slurry including a ceramics powder, a binder and a solvent, or the like.

Figure 5C:
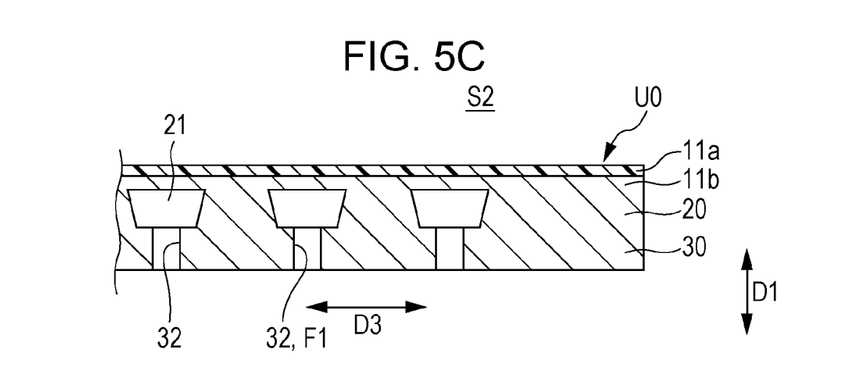

Next, as shown in FIG. 5C, the first layer 11a is formed at the side of the second layer 11b of the piezoelectric unit main body 101 (a second process: S2). As a method thereof, the precursor of the first layer 11a is formed by applying a solution in which an organic metal such as zirconia alkoxide and zirconia acetate is dispersed in a solvent at the side of the second layer 11b of the diaphragm (the spacer portion 20). As a method of applying the precursor, a well-known spin-coat method can be used. Then, the piezoelectric unit main body 101 in which the precursor is formed is degreased from 100° C. to 300° C. Then, the first layer 11a is formed on the second layer 11b by calcinating the piezoelectric unit main body 101 from 500° C. to 700° C.

Here, it is possible to calcinate the first layer 11a at a lower temperature which is from 500° C. to 700° C., compared to the second layer 11b by forming using a solution method. If the calcination temperature is low, since it is possible to delay the growth speed of a zirconia crystal, it is possible to make the crystal size of the first layer 11a smaller, compared to that of the second layer 11b. That is, it is possible to flatten the first layer 11a.

Figure 6A:
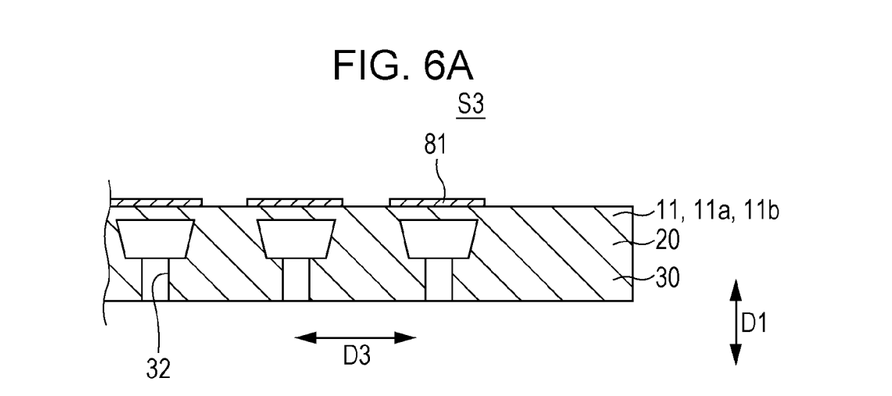
FIGS. 6A to 6C are process views showing a method of manufacturing a liquid ejecting head.
Figure 6B:
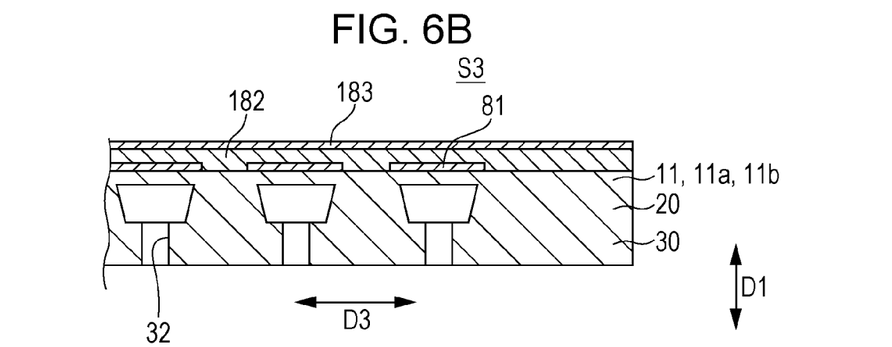
Figure 6C:
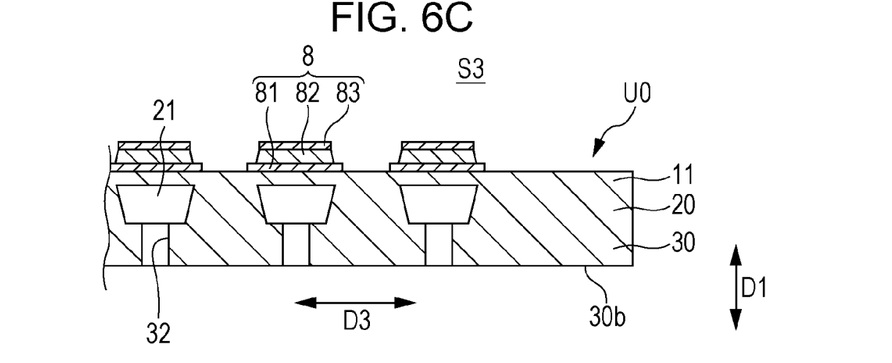

Next, as shown in FIGS. 6A to 6C, the piezoelectric element 8 is formed on the diaphragm 11 (a third process: S3).

Therefore, firstly, as shown in FIG. 6A, the lower electrode 81 is formed on the diaphragm 11 (the first layer 11a). As a method thereof, firstly, a lower electrode layer is formed on the diaphragm 11 by using a sputtering method. Next, the exposure is performed with respect to the lower electrode layer, corresponding to the pattern of the pressure chamber 21 by using photolithography. Then, a resist except the part which becomes the lower electrode 81 is removed, afterward; patterning is performed by reactivity dry etching, ion milling or the like to form the lower electrode 81 on the diaphragm 11.

It is possible to form the lower electrode 81 in which the crystal orientation is aligned on the diaphragm 11 by forming the lower electrode 81 using the sputtering method. Except this, a method of forming the lower electrode 81 may be one using another technique such as a well-known solution method as long as the method is one capable of increasing the orientation degree.

Then, as shown in FIG. 6B, layers 182 and 183 which become the base of the piezoelectric layer 82 and the upper electrode 83 are formed at an upper part of the lower electrode 81. As a method of forming the layer 182, in a case of using PZT, a PZT liquid in which a metal alkoxide, a metal acetate, or the like including a metal configuring PZT or the like is dispersed in a solvent is applied onto the lower electrode 81 by the spin-coat method to form the precursor. Next, after the precursor is degreased from 100° C. to 300° C., the precursor is calcinated from 600° C. to 700° C. and the layer 182 is formed. Here, a series of processes of applying, degreasing and calcinating described above are repeated until the film thickness of the layer 182 becomes the predetermined film thickness (for example, from 1 to 3 micrometer). Then, the layer 183 which becomes the base of the upper electrode 83 on the layer 182 is formed using the spin-coat method or the like.

Furthermore, as shown in FIG. 6C, the patterning is performed with respect to the layers 182 and 183 and the piezoelectric layer 82 and the upper electrode 83 corresponding to the pressure chamber 21 are formed. As a method of patterning for forming the piezoelectric layer 82 and the upper electrode 83, well-known photolithography can be used in the same way as the lower electrode 81.

After a resist pattern is formed on the diaphragm and the electrode and the piezoelectric layer are formed on the entire surface of the diaphragm, the electrode and the piezoelectric layer may be removed together with the resist pattern, except the method of forming the piezoelectric element 8 described above.

Afterward, the piezoelectric unit U0, the sealing plate 40, the reservoir plate 50 and the nozzle plate 60 are joined and the control circuit substrate 91 is connected to the piezoelectric element 8 using the cables 92. As joining between the members U0, 40, 50 and 60, a method of performing the thermocompression bonding between each member in a state in which an adhesive sheet for thermocompression in which substantially the same hole as the plate is formed is sandwiched between the members, a method of applying an adhesive agent in liquid form between the members, a method of performing the thermocompression between each member using a member having a thermocompression property (self-compression bonding property), or the like can be used. The connection of the control circuit substrate 91 may be performed before joining a part or the whole between the members U0, 40, 50 and 60.

From the above, the liquid ejecting head 1 as shown in FIGS. 3A and 3B is manufactured.

As explained above, in the first embodiment, the planarizing layer is formed between the diaphragm and the piezoelectric element made of ceramics. Therefore, since the crystal orientation of the layer formed by the piezoelectric material included in the piezoelectric element is aligned by this planarizing layer, it is possible to improve the piezoelectric constant, the stability of the operation, and furthermore, the durability of; the piezoelectric element.

In addition, as a technique of flattening, it is possible to easily form the planarizing layer in the member using the ceramics by making the crystal size at the side of the piezoelectric element of the diaphragm smaller.

Then, owing to having the lower electrode configured by a metal on the planarizing layer, it is possible to further align the crystal orientation of the piezoelectric layer.

Furthermore, since the end portion of the lower electrode extends to the border between the active portion and the inactive portion of the diaphragm, it is possible to reinforce the part at which the stress concentration easily occurs by the lower electrode and thus, it is possible to enhance the durability of the piezoelectric unit.

In addition, since the orientation of the crystal of the piezoelectric layer is preferentially oriented to (100), the piezoelectric constant of the piezoelectric layer is enhanced, the performance and the polarization axis of the piezoelectric unit are stabilized and thus it is possible to enhance the reliability.

2. Another Embodiment

FIG. 7 shows the outside appearance of the liquid ejecting apparatus 200 which is an ink jet type recording apparatus having the liquid ejecting head 1 as a recording head. When the liquid ejecting head 1 is incorporated in recording head units 211 and 212, it is possible to manufacture the liquid ejecting apparatus 200. In the liquid ejecting apparatus 200 shown in FIG. 7, the recording head units 211 and 212 are respectively provided with the liquid ejecting head 1 and are detachably provided with ink cartridges 221 and 222 which are an external ink supply section. A carriage 203 mounting the recording head units 211 and 212 is provided so as to be capable of reciprocating along a carriage axis 205 which is installed in an apparatus main body 204. When a driving force of a driving motor 206 is transmitted to the carriage 203 through plural gears (not shown) and a timing belt 207, the carriage 203 is moved along the carriage axis 205. A recording sheet 290 which is fed by a paper feeding roller (not shown) or the like is transported onto a platen 208 and printing is performed by ink drops which are supplied from the ink cartridges 221 and 222 and ejected from the liquid ejecting head 1.

Various types of modification examples in the invention are considered.

In the first embodiment, by the particle diameter of the powder of the green sheets of the first layer 11a and the second layer 11b being made differently from each other, the first layer 11a may be flattened.

The liquid ejecting apparatus may also be a so-called line head type printer in which the liquid ejecting head is fixed so as not to be moved while printing and printing is performed by only moving the recording sheet.

A liquid discharged from the liquid ejecting head has to be a material capable of being discharged from the liquid ejecting head and a fluid such as a solution in which a dye or the like is dissolved in a solvent, or a sol in which solid particles such as a pigment or metal particles are dispersed in a dispersion medium is included. Such a fluid includes an ink, a liquid crystal or the like. The liquid ejecting head is capable of being mounted on an apparatus for manufacturing a color filter such as a liquid crystal display, an apparatus for manufacturing an electrode such as an organic EL display or an FED (a field emission display), an apparatus for manufacturing a biochip or the like, in addition to an image recording apparatus such as a printer.

In addition, products using the piezoelectric unit are not limited to the liquid ejecting head and the liquid ejecting apparatus. That is, the piezoelectric unit may also be used as a part of an infrared ray sensor, a force sensor, an acceleration sensor, a gyro or an ultrasonic sensor which converts from a mechanical change or an electromagnetic wave (light) and sound wave change to an electrical change.

The piezoelectric element is not limited to a thin film type and may be a laminated type in which the piezoelectric material and the electrode material are alternately laminated, a longitudinal vibration type in which a pressure change is given to each pressure chamber by the longitudinal vibration, or the like. Furthermore, it is possible to apply to various other types of piezoelectric units.

The diaphragm may be joined to the spacer portion after calcinating and forming apart from the spacer portion and the connection portion which form the liquid channel. The spacer portion and the connection portion may not be made of ceramics such as a metal or a synthetic resin.

In addition, a configuration in which each configuration disclosed in the embodiment and the modification example described above is mutually replaced or a combination thereof is changed, a configuration in which each configuration disclosed in a well-known technique, and the embodiment and the modification example described above is mutually replaced or a combination thereof is changed, or the like is also capable of being conducted. The invention includes these configurations or the like.

The entire disclosure of Japanese Patent Application No. 2013-123323, filed Jun. 12, 2013 is expressly incorporated by reference herein.

What is claimed is:

1. A piezoelectric unit comprising:
a diaphragm including a ceramic material;
a base portion having a pressure chamber, the diaphragm forming a wall of the pressure chamber; and
a piezoelectric element having a dielectric layer provided at a side of the diaphragm that is opposite to the pressure chamber,
wherein the ceramic material of the diaphragm includes a plurality of layers having different crystal sizes, a crystal size of the ceramic material at the side of the diaphragm that is opposite to the pressure chamber being less than a crystal size of the ceramic material at a side of the diaphragm adjacent the pressure chamber.

2. The piezoelectric unit according to claim 1,
wherein the ceramic material of the diaphragm includes a first layer at the side of the diaphragm that is opposite to the pressure chamber and a second layer at the side of the diaphragm adjacent the pressure chamber, the first layer having a smaller crystal size compared to the second layer and configured with a planarizing layer.

3. The piezoelectric unit according to claim 1,
wherein the piezoelectric element includes a first electrode provided at an interface between the diaphragm and the piezoelectric element, the dielectric layer, and a second electrode provided at an opposite side of the dielectric layer with respect to the first electrode.

4. The piezoelectric unit according to claim 3,
wherein an end portion of the first electrode is formed by extending over from an active portion to an inactive portion of the piezoelectric element.

5. The piezoelectric unit according to claim 3,
wherein an end portion of the first electrode is formed longer than an end portion of the second electrode by a length d in a predetermined direction, and the length d is set to be thicker than a thickness of the dielectric layer configuring the piezoelectric element.

6. The piezoelectric unit according to claim 3,
wherein a crystal orientation of the dielectric layer is preferentially oriented to (100).

7. A liquid ejecting head comprising:
the piezoelectric unit according to claim 1; and
a nozzle plate in which a nozzle hole connecting with the pressure chamber is formed.

8. A liquid ejecting apparatus comprising:
the liquid ejecting head according to claim 7.

* * * * *